(12) United States Patent
Niederhausen et al.

(10) Patent No.: US 11,175,595 B2
(45) Date of Patent: Nov. 16, 2021

(54) METHOD FOR LOCALIZING ASSEMBLY ERRORS (71) Applicant: Carl Zeiss SMT GmbH, Oberkochen (DE)

(72) Inventors: Thomas Niederhausen, Aalen (DE); Christoph Fetzer, Neu-Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/575,985

(22) Filed: Sep. 19, 2019

(65) Prior Publication Data

US 2020/0012197 A1 Jan. 9, 2020

Related U.S. Application Data

(63) Continuation of application No. PCT/EP2018/005716, filed on Mar. 21, 2018.

(30) Foreign Application Priority Data

Mar. 21, 2017 (DE) .......................... 102017204685.6

(51) Int. Cl.
*G03F 7/20* (2006.01)
*G06K 9/62* (2006.01)
*G06F 11/07* (2006.01)

(52) U.S. Cl.
CPC ............ *G03F 7/709* (2013.01); *G03F 7/7085* (2013.01); *G03F 7/70825* (2013.01); *G03F 7/70883* (2013.01); *G03F 7/70975* (2013.01); *G06F 11/0754* (2013.01); *G06K 9/627* (2013.01)

(58) Field of Classification Search
CPC .... G03F 7/709; G03F 7/70883; G03F 7/7085; G03F 7/70975; G03F 7/70141; G03F 7/70258; G03F 7/70483; G03F 7/70491; G03F 7/705; G03F 7/70508; G03F 7/70516; G03F 7/70533; G03F 7/70541; G03F 7/70591; G03F 7/708; G03F 7/70808; G03F 7/70816; G03F 7/70825; G03F 7/70833; G06K 9/627; G06K 9/00543;
(Continued)

(56) References Cited

U.S. PATENT DOCUMENTS

| 6,556,364 B2 * | 4/2003 | Meehan ................. G02B 7/023 355/53 |
| 10,007,186 B2 | 6/2018 | Prochnau et al. |
| 2003/0090645 A1 | 5/2003 | Kato |

(Continued)

FOREIGN PATENT DOCUMENTS

| CN | 102834775 A | 12/2012 |
| JP | H07-325628 A | 12/1995 |
| TW | 201617742 A | 5/2016 |

OTHER PUBLICATIONS

Taiwanese Office Action, with translation thereof, for corresponding Appl No. 107109704, dated Jan. 15, 2019.

(Continued)

*Primary Examiner* — Christina A Riddle
(74) *Attorney, Agent, or Firm* — Fish & Richardson P.C.

(57) ABSTRACT

A method localizes assembly errors during the arrangement and/or the assembly of in particular vibration-isolated structural elements, in particular of components of optical arrangements, preferably of microlithographic projection exposure apparatuses.

20 Claims, 3 Drawing Sheets

(58) Field of Classification Search
CPC ....... G06F 11/0754; G02B 7/02; G02B 7/023;
G02B 7/182–7/183; G02B 7/185–7/198
USPC ......... 355/18, 30, 39, 46, 52–63, 66–71, 77,
355/133; 702/1, 33, 35, 36, 41, 56;
359/819–830, 871–883
See application file for complete search history.

(56) References Cited

U.S. PATENT DOCUMENTS

| | | |
|---|---|---|
| 2011/0200944 A1 | 8/2011 | Ichinose |
| 2012/0067833 A1 | 3/2012 | Kugler et al. |
| 2016/0255341 A1* | 9/2016 | Mateti .................. H04N 17/002 348/187 |

OTHER PUBLICATIONS

International Search Report and Written Opinion for corresponding PCT Appl No. PCT/EP2018/057136, dated Jul. 13, 2018.
Seshadrinath Jeevanand et al.: "Vibration Analysis Based Interturn Fault Diagnosis in Induction Machines", IEEE Transactions on Industrial Informatics, IEEE Service Center, New York, NY, US, vol. 10, No. 1, Feb. 1, 2014.
International Preliminary Report on Patentability for corresponding PCT Appl No. PCT/EP2018/057136, dated Oct. 3, 2019.

\* cited by examiner

METHOD FOR LOCALIZING ASSEMBLY ERRORS

FIELD

The present disclosure relates to a method for localizing assembly errors during the arrangement and/or the assembly of in particular vibration-isolated structural elements, in particular of components of optical arrangements, preferably of microlithographic projection exposure apparatuses.

BACKGROUND

In microlithographic projection exposure apparatuses with which nanostructured and microstructured structural elements of microelectronics and microstructuring technology can be produced, structural elements and components of the projection exposure apparatus are generally mounted as isolated from vibrations as possible due to the precision of the arrangement of components that is used for a high resolution of such apparatuses, so that negative influences by externally caused vibrations and thus associated position changes of the structural elements or components are avoided.

Accordingly, optical components in projection exposure apparatuses and in particular in projection lenses of microlithographic projection exposure apparatuses can be installed in a free-swinging carrier frame (optic frame), wherein the carrier frame can be stabilized by actuators that counteract external vibrations. Here, sensors capture movements of the carrier frame with respect to specified reference positions in all six degrees of freedom of movement, with the result that the actuators can be controlled or regulated such that a change in position and/or a change in the spatial orientation of the carrier frame is counteracted.

In vibration-isolated structural elements of this type, such as carrier frames for optical components, it is therefore important for the free-swinging mounting to be maintained uninterruptedly at all times so as to ensure dynamic stabilization and vibration isolation.

Accordingly, during mounting, i.e. during the arrangement and/or the assembly of such structural elements, the free mounting of the structural element and the dynamic stabilization and vibration isolation is desirably prevented from being compromised due to unintended mechanical contact of the free-swinging structural element with a neighbouring component, e.g. if cables or the like inadvertently come into contact with the structural element.

Moreover, incorrectly mounted components on the carrier frame, e.g. screws that have not been tightened, can negatively impact the vibration behavior of the structural element and thus the dynamic stabilization and vibration isolation, for example if additional sources of vibration are introduced due to a loose arrangement of components. By way of example, incorrectly fastened attachment parts on the carrier frame can result in additional vibrations, with the result that the dynamic stabilization and vibration isolation due to the actuation of the corresponding actuators are made more difficult.

Corresponding assembly errors, such as unintended mechanical contacts at a free-swinging or vibration-isolated structural element or the introduction of additional vibration components due to components having been inadequately fastened can be detected in corresponding structural elements, such as carrier frames for optical components, by the mounted structural element being excited to vibrations via the existing actuators of the active regulation for dynamic stabilization and vibration isolation, wherein the vibration behavior of the structural element under test as produced by the excitation is captured and compared to a reference behavior that corresponds to a vibration behavior of a correctly arranged and mounted structural element. If differences between the captured vibration behavior produced by the excitation and the reference behavior of a correctly mounted structural element are ascertained, it is possible to deduce therefrom that an assembly error has occurred.

In assembly errors that are due to mechanical contacts of the free-swinging structural element, frequency shifts of the known natural frequencies of the structural element or attenuations of the corresponding natural frequencies can be observed. Individual parts that have been mounted incorrectly can be detected by additional resonance frequencies in the spectra.

When exciting the structural element to vibrations and capturing possible differences of the excited vibration behavior of the structural element relative to a reference behavior, the procedure is that the actuators are actuated alone and in combination with different superpositions of actuations of the actuators over a frequency range in order to excite vibrations with different frequencies and different vibration characteristics and to capture the vibration response of the structural element thereto. This is also referred to as a frequency response measurement.

Although assembly errors can be reliably detected with this method, one issue is that no information or insufficient information relating to the type and in particular relating to the position of the assembly error is provided.

To eliminate the assembly error, it is therefore desirable to perform, for example using endoscopic methods, a complicated investigation of the assembly arrangement, i.e. for example of the optical system arranged on a carrier frame, or the already arranged and mounted structural element is stripped down step by step so as to uncover assembly errors step-by-step. This can be highly time-consuming and expensive and consequently, there is a demand for an improvement of the ascertainment of assembly errors.

SUMMARY

The present disclosure seeks to provide a method for localizing assembly errors that permits better identification of the location and/or the type of the assembly error so as to be able to prevent complicated inspections of the already mounted structural element. A corresponding method for localizing assembly errors should be capable of being performed easily and permit targeted correction of the assembly error.

In an aspect, the disclosure provides a method for localizing assembly errors during the arrangement and/or the assembly of in particular vibration-isolated structural elements, in particular of components of optical arrangements, preferably of microlithographic projection exposure apparatuses. The method includes: a) exciting the structural element to be investigated to vibrations with respect to axes of vibration in at least three independent spatial directions and capturing the vibration behavior of the excited structural element; and b) comparing the captured vibration behavior to a reference behavior of the correctly mounted structural element and determining whether a deviation that exceeds a determined limit value has occurred. The method also includes: c1) repeatedly performing steps a) and b), wherein during the repeated performance of steps a) and b), an excitation of the structural element to be investigated to vibrations with respect to axes of vibration in at least three independent spatial directions is performed that differs from the previous excitations, and identifying the excited axes of vibration having the minimum and/or to maximum deviation from the reference behavior, and localizing an assembly error on the basis of the identified axes of vibration; and/or c2) evaluating the captured vibration behavior with respect to a plurality of fictitious axes of vibration, and identifying the fictitious axis of vibration having the minimum and/or maximum deviation from the reference behavior, and localizing an assembly error on the basis of the identified fictitious axis of vibration.

In an aspect, the disclosure provides a computer program that includes instructions that, upon execution of the program by a computer, cause the latter to perform a method disclosed herein.

In an aspect, the disclosure provides a microlithographic projection exposure apparatus having a control unit, in which a computer program disclosed herein is executed or a method disclosed herein is performed.

The present disclosure is based on the finding that assembly errors, such as components that have been incorrectly arranged or components that erroneously rest on a free-swinging structural element, have different influences on the vibration behavior produced by the vibration excitation, depending on the orientation of the observed vibration with respect to the assembly error. By way of example, if a vibration about an axis of rotation is observed, an assembly error that is assigned directly to the axis of rotation will have no major effects on the excited vibration behavior, while an assembly error that is situated at a distance from the axis of rotation will have a major influence on the excited vibration behavior of the structural element due to the given torque. Consequently, in the case of a vibration about an axis of rotation, an extrinsic structural element resting on the structural element to be investigated directly at the axis of rotation will have effects on the excited vibration behavior that are not as great as if the resting extrinsic structural element were situated at a distance from the axis of rotation. In the same way, inadequate tightening of a screw connection at the axis of rotation will have less effect on the excited vibration behavior than an insufficiently tightened screw connection that is located at a distance from the axis of rotation and correspondingly exhibits a torque with respect to the axis of rotation. In addition to undesired contacts of structural elements or incorrectly mounted structural elements, it is also possible to capture missing or additional masses, such as missing components or the like, in this way.

Accordingly, localization of an assembly error can be performed by first exciting the structural element to be investigated to vibrations in accordance with known frequency response measurements, specifically to vibrations with respect to axes of vibration in at least three independent spatial directions, and capturing the vibration behavior of the excited structural element. The excitation of the structural element to be investigated advantageously can be performed for example by actuators that are already situated at the vibration-isolated structural element for dynamic stabilization or regulated vibration isolation. Capturing the vibration behavior of the excited structural element can be done by sensors that are preferably already provided at the corresponding structural element for controlling and/or regulating the actuators in a structural element with dynamic position stabilization and orientation stabilization.

After the excited vibration behavior of the structural element has been captured, said captured vibration behavior can be compared to a reference behavior that corresponds to the vibration behavior of an identically excited, correctly mounted structural element. By comparing the captured vibration behavior to the reference behavior, it is possible to determine whether a deviation has occurred that suggests that an assembly error is present. In this context, a limit value can be defined that is to be exceeded by the deviation in order for it to be identified as a deviation.

The above-mentioned steps of the method including the excitation of the structural element to be investigated to vibrations, capturing the vibration behavior of the excited structural element and comparing the captured vibration behavior to a reference behavior and also determining a deviation is repeated multiple times, wherein the vibration excitation is performed with respect to different independent spatial directions. Since the vibration excitation takes place in different orientation with respect to a possible assembly error, the captured vibration behavior is characterized differently by the assembly error, and by identifying the minimum and/or maximum deviation of the induced vibration behavior from the reference behavior in dependence on the vibration excitation with respect to different spatial directions, it is possible to localize the assembly error.

By way of example, if in a first run-through of the method a vibration excitation is performed in a manner such that the x-, y- and z-axes of a Cartesian coordinate system serve as the axes of rotation for rotational vibrations, and if in a second run-through a vibration excitation is performed in a manner such that the x'-, y'- and z'-axes of a different Cartesian coordinate system are used as axes of rotation for a rotational vibration, it is possible to deduce how the assembly error is arranged relative to the different axes of rotation by comparing the ascertained deviations. With a large number of excitations with different axes of rotation and a corresponding comparison of the captured vibration behavior to said different axes of rotation, it is possible to determine the location of the assembly error.

In order to avoid the complexity for performing a large number of frequency behavior measurements with different characteristics of the vibration excitation, it is possible to mathematically evaluate the captured values with respect to the vibration behavior of the structural element from an excitation of the structural element to be investigated to vibrations with respect to axes of vibration in at least three independent spatial directions such that the captured vibration behavior is evaluated with respect to a large number of fictitious axes of vibration in order to obtain information relating to the position and/or type of the assembly error in this way. In this variant, no additional frequency response measurements are thus involved; rather, the already available data of a frequency response measurement with the excitation of the structural element to be investigated to vibrations with respect to three independent spatial axes are merely additionally evaluated to not only indicate that an assembly error is present in the first place, but also to effect the localization of the assembly error. Due to the fact that the captured vibration behavior is analyzed in terms of what the captured vibration behavior is like with respect to a large number of fictitious axes of vibration, it is possible to identify a fictitious axis of vibration having a minimum or maximum deviation from the reference behavior, with the result that the assembly error can be localized proceeding from said information. By way of example, it is possible to ascertain, in an evaluation of the captured vibration behavior with respect to a large number of fictitious axes of rotation, at which fictitious axis of rotation the deviation of the captured vibration behavior from a reference behavior is minimum. This fictitious axis of rotation then indicates that the assembly error is to be situated on this axis of rotation. Hereby, localization of the assembly error is possible.

The excitation to vibrations in the first method step (method step a)) can in particular include the excitation to rotational vibrations about three independent spatial directions, that is to say for example about axes of rotation along the independent spatial axes of a Cartesian coordinate system. Additionally or alternatively, excitations to translational vibrations can be provided, wherein in the case of exclusive excitations to translational vibrations, translational vibrations in three independent spatial directions can be performed, while in the case of an additional excitation to translational vibrations, it is possible, in addition to the already performed excitations to rotational vibrations, for the translational vibrations to be performed merely in at least one spatial direction. It is of course also possible in a corresponding fashion for rotational vibrations about at least one axis of rotation to be excited in addition to translational vibrations in three independent spatial directions. Overall, a diverse combination of different vibration excitations with respect to different types of vibrations is possible.

Accordingly, for the evaluation of the captured vibration behavior, the evaluation can be effected with respect to a large number of fictitious axes of rotation and/or axes of translation.

The large number of the fictitious axes of vibration that are used for the evaluation of the captured vibration behavior of the excited structural element are defined by the fact that they extend through the centre of mass of the structural element under investigation and have spherical coordinates with an azimuth angle $\varphi$ between 0 and $2\pi$ and a polar angle $\vartheta$ between 0 and $2\pi$. The large number of the fictitious axes of vibration can vary by way of stepwise variation of the azimuth angle $\varphi$ and the polar angle $\vartheta$ by preferably uniform distances between 0 and $2\pi$. By way of example it might be possible to use fictitious axes of vibration with 360 different azimuth angles $\varphi$ and 360 different polar angles $\vartheta$, wherein the distance between the individual fictitious axes of vibration in the direction of the azimuth angle $\varphi$ and of the polar angle $\vartheta$ would in each case be 1°. Increments of the angular variation with fractions of a degree are of course also possible.

In order to further improve the localization of the assembly error, the method can be performed multiple times in succession, wherein in the second run-through or in further run-throughs, the position of the centre of mass of the structural element to be investigated can be changed by adding or removing mass, or the effective point of attack of the forces for the vibration excitation can be changed by superposing excitation forces. As a result, a changed point of origin of the fictitious axis of vibration is obtained in the evaluation of the fictitious axes of vibration, with the result that the point of intersection of the fictitious axes of vibration having minimum or maximum deviation from the reference behavior, which axes of vibration have been ascertained in the two or more run-throughs with different point of origin for the fictitious axes of vibration, exactly identifies the location of the assembly error. This is also possible in the same way for the alternative with the experimental determination of a corresponding axis of vibration.

In the alternative with the change in the effective point of attack during the repeated performance of the method, the position of the centre of mass is effectively changed by superposition of the excitation forces without changing the structural element to be investigated, since the superposition of excitation forces of the actuators brings about a fictitious displacement of the centre of mass.

The ratio of the amplitude of the captured vibration behavior at a specific frequency to the amplitude of the reference behavior at said frequency can serve as a measure for the deviation of the captured vibration behavior from the reference behavior of a correctly mounted structural element. For example, if, in the case of incorrect mounting of a component to the structural element, an additional natural vibration of the system at a specific frequency f is detected, the ratio of the amplitude of the captured vibration at said frequency to the amplitude of the reference at said frequency will indicate an error $\Delta$. The same is true for the case in which an additional attenuation or a shift of a natural frequency occurs due to unintended contact of the structural element to be investigated with an extrinsic structural element. The ratio between the captured amplitude at the corresponding frequency of the captured vibration behavior to the amplitude of the reference behavior at said frequency will indicate an error $\Delta$ here as well ($\Delta = a_\nu^{captured} / a_\nu^{reference}$), wherein $a_\nu^{captured}$ is the captured amplitude at the shifted natural frequency $\nu$ and $a_\nu^{reference}$ is the corresponding amplitude of the reference behavior at the frequency $\nu$.

The frequencies can be chosen in the frequency range from 0.1 Hz to 100 kHz.

The method can be performed in an electronic data processing system, in which a computer program runs that includes instructions that, upon execution of the program by the computer, causes the latter to perform the method. Accordingly, a computer program and a microlithographic projection exposure apparatus having a control unit in which the computer program for performing the method is executed are also subject matter of the present disclosure.

The mathematical description can be done as follows:

Mechanical systems are commonly described in the frequency domain by:

$$y = G * u,$$

wherein
y represents the initial values (complex vector), e.g. Shifts, rotation,
u represents the input values (complex vector), e.g. forces, and
G represents the frequency-dependent transmission behavior (complex function).

For a system with several spatial directions, this means:

$$\begin{bmatrix} u_1 \\ u_2 \\ \vdots \\ u_m \end{bmatrix} = G(f) * \begin{bmatrix} y_1 \\ y_2 \\ \vdots \\ y_m \end{bmatrix}$$

In order to determine the desired input values and to assess how the system would react to it with regard to its rotation, the following applies:

$$u = G^{-1} * y$$

The division of the input values and output values into rotation and translation yields $$u = \begin{bmatrix} u_t \\ u_r \end{bmatrix}, u_t = \begin{bmatrix} u_1 \\ \vdots \\ u_n \end{bmatrix}, u_r = \begin{bmatrix} u_{n+1} \\ \vdots \\ u_m \end{bmatrix}$$

-continued $$y = \begin{bmatrix} y_t \\ y_r \end{bmatrix}, y_t = \begin{bmatrix} y_1 \\ \vdots \\ y_n \end{bmatrix}, y_r = \begin{bmatrix} y_{n+1} \\ \vdots \\ y_m \end{bmatrix}$$

It applies:

$$u = \begin{bmatrix} u_t \\ u_r \end{bmatrix} = G^{-1} * y(\varphi, \theta)$$

wherein the parameterization of y is accomplished on the angle φ and θ, that is, the azimuth and polar angles of a spherical coordinate system.

The criterion for determining the deviation from the reference transmission behavior is:

$$\Delta u(\varphi,\theta) = u_{Ref}(\varphi,\theta) - u_{Fehler}(\varphi,\theta) = (G^{-1}_{r,Ref} - G^{-1}_{r,Fehler}) * y_r(\varphi,\theta)$$

with
$G^{-1}_{r,Ref}$: reference transmission behavior
$G^{-1}_{r,Fehler}$: transmission behavior with disturbance By searching the minimum of Δu, the direction (vector) of the disturbance can be determined:

$$\min_{\varphi,\theta} \|\Delta u(\varphi, \theta)\| = y_{r,0}$$

Clearly this corresponds to the direction in which the lever of the disturbance is minimal.

As a measure of the determination of the minimum, the 2-norm of Δu can be used. There would also be other standards possible, such as phase relationships.

Subsequently, the center of rotation can be mathematically shifted and the above procedure can be carried out again.

However, a shift of the rotation point also involves translations in the origin, which is to be considered in the further calculation.

This leads to the following equation:

$$\Delta u_1(\varphi, \theta) = \{(G^{-1}_{r,Ref} + S_1 * G^{-1}_{t,Ref}) - (G^{-1}_{r,Fehler} + S_1 * G^{-1}_{t,Fehler})\} * y_{r,1}(\varphi, \theta)$$

$$\min_{\varphi,\theta} \|\Delta u_1(\varphi, \theta)\| = y_{r,1}$$

with
$S_1$: rotation/shift vector

Ideally, both vectors intersect at one point. In reality, however, at least one more additional shift of the rotation point can be made, since environmental conditions, imperfections of the system itself and of the measuring system can lead to the vectors not intersecting.

To further improve the determination of the position of the disturbance, another criterion can be used. The maximum deviation of the natural frequencies of the system due to the fault.

This gives the following condition:

$$\min_{\varphi,\theta} \|\Delta u_2(\varphi, \theta)\| = \max_{\alpha,\beta} \|(G^{-1}_{r,Ref} - G^{-1}_{r,Fehler}) * y_r(\varphi, \theta)\| = y_{r,2}$$

Again, the center of rotation can be moved again to determine another vector $$\Delta u_3(\varphi,\theta) = \{(G^{-1}_{r,Ref} + S_1 * G^{-1}_{t,Ref}) - (G^{-1}_{r,Fehler} + S_1 * G^{-1}_{t,Fehler})\} * y_r(\varphi,\theta)$$

from which in turn the maximum of the deviation can be determined.

$$\min_{\varphi,\theta} \|\Delta u_3(\varphi, \theta)\| = y_{r,3}$$

However, the found vectors $y_{r,2}$ and $y_{r,3}$ no longer pass through the disturbance but are orthogonal to it. That means $y_r$ spans with $y_{r,2}$ the plane $E_1$ and $y_{r,1}$ spans with $y_{r,3}$ the plane $E_2$.

On the intersection line $k_1$ of the two planes $E_1$ and $E_2$ thus generated, again, the sought fault is located.

If the resulting vectors do not intersect in exactly one point, which is possible in reality, a corresponding further optimization can follow the calculations of the directions/vectors of the disturbances in order to estimate the coordinates of the disturbance as exactly as possible.

BRIEF DESCRIPTION OF THE FIGURES

The enclosed figures are purely schematic.

EXEMPLARY EMBODIMENTS

Further advantages, characteristics and features of the present disclosure will become clear in the following detailed description of exemplary embodiments, although the disclosure is not limited to said exemplary embodiments.

Figure 1:
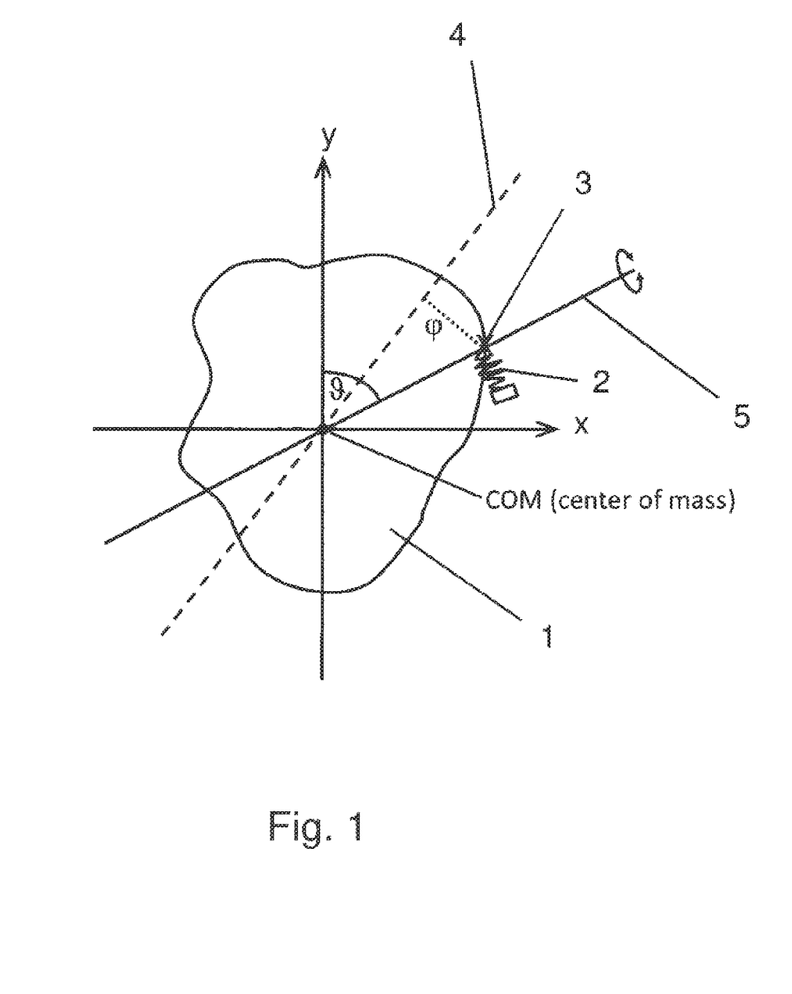
FIG. 1 is a schematic for illustrating the underlying principle of the present disclosure in two-dimensional representation.

FIG. 1 shows, in a two-dimensional representation, a structural element 1, for example a carrier frame for optical components of an EUV projection exposure apparatus, that for illustrating the arbitrary form of the structural element 1 is depicted as an arbitrary rigid body. An extrinsic structural element 2 rests against the structural element 1 at the resting point 3. Upon vibration about the axis of rotation 4, a strong influence acts on the vibration behavior of the structural element 1 about the axis of rotation 4 due to the distance p of the resting point 3 from the axis of rotation 4. However, when observing a vibration about the axis of rotation 5, which extends through the resting point 3 of the extrinsic structural element 2 at the structural element 1 and the centre of mass of the structural element 1, the influence on the vibration behavior of the structural element 1 about the axis of rotation 5 becomes minimum.

Figure 2:
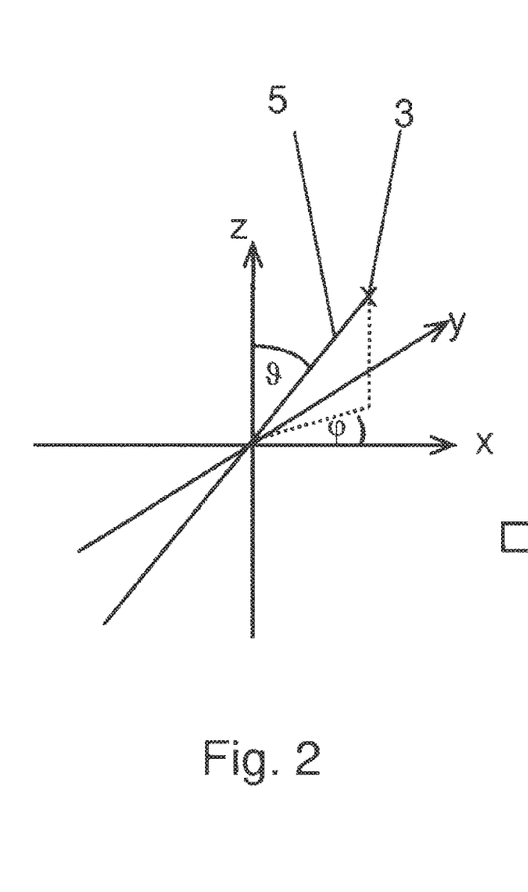
FIG. 2 is a representation of the principle of the present disclosure for the three-dimensional case.
Figure 3:
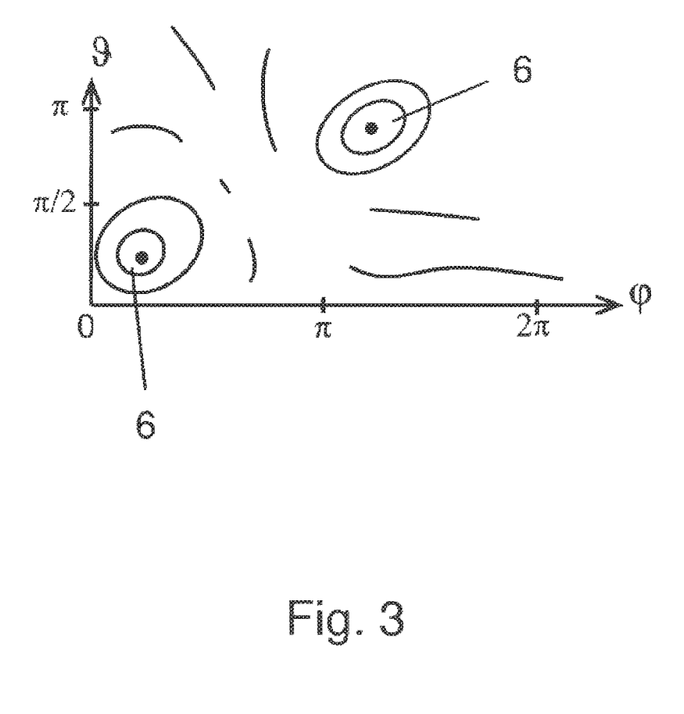
FIG. 3 is a representation of a schematic relating to the evaluation of the captured vibration behavior.

This is also illustrated by FIG. 2 for the three-dimensional case, wherein the three-dimensional space is defined by the coordinate system x, y and z. In the case of an axis of rotation 5 that extends through the location of the assembly error 3, the influence on the rotational vibration about the axis of vibration 5 is minimum. The axis of vibration 5 is characterized by the spherical coordinates φ and ϑ. In a representation in a schematic in accordance with FIG. 3, in which the deviation of the captured vibration behavior from a reference behavior at the different axes of rotation is plotted over the spherical coordinates (φ, ϑ), it can be seen that two minima 6 which define the straight line through the axis of rotation (φ, ϑ) and (φ+π, ϑ+π) occur.

Figure 4:
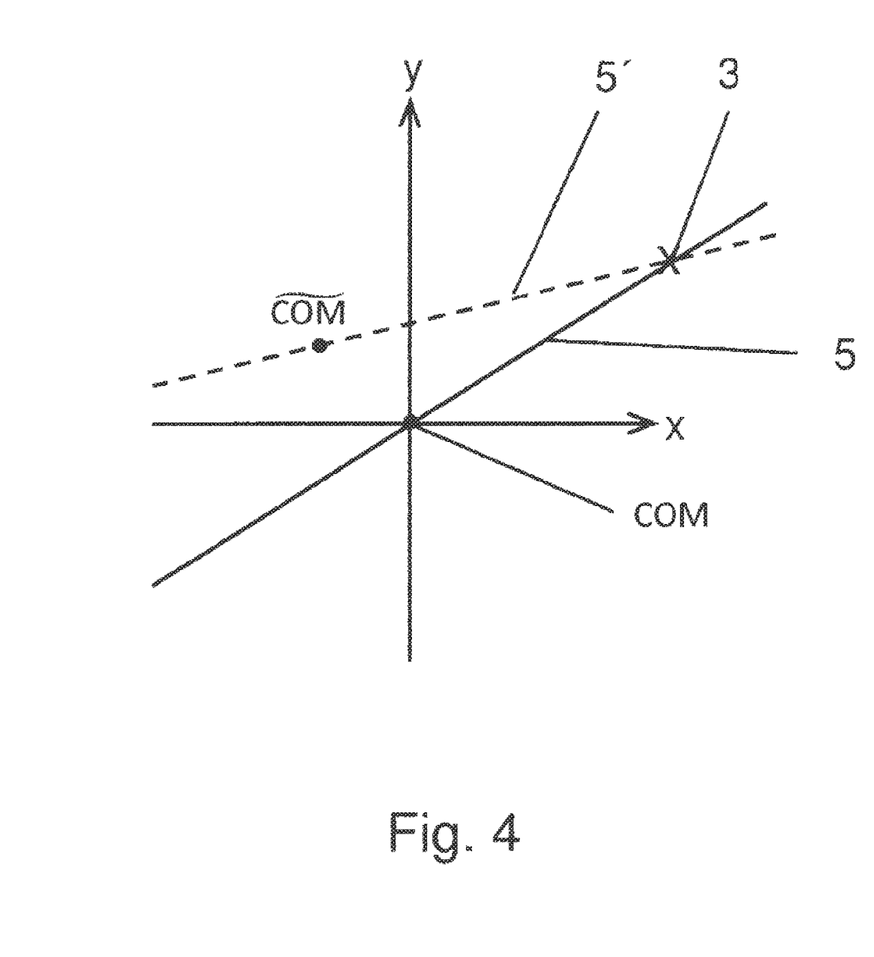
FIG. 4 is a representation of the method according to the disclosure for localizing an assembly error in the case of repeated performance of the method with different centres of mass of the structural element to be investigated.

Since the only thing known when determining the position of the assembly error with respect to an axis of rotation is that the assembly error can be located on said axis of rotation, but it is not known where on said axis the assembly error is located, the method can be performed, as is shown in FIG. 4, for at least two positions of the centre of mass or fictitious positions of the centre of mass of the structural element, wherein the ascertained axes of rotation 5 and 5' for the two positions of the centre of mass indicate in each case that the position of the assembly error 3 is on said axes of rotation 5 or 5'. For a more accurate localization, the point of intersection of the axes of rotation 5 and 5' can then be determined to accurately localize the position 3 of the assembly error.

Although the present disclosure has been described in detail by way of the exemplary embodiments, it is obvious to a person skilled in the art that the disclosure is not restricted to these exemplary embodiments but rather that modifications are possible such that individual features can be omitted or different types of combinations of features can be implemented, as long as there is no departure from the scope of protection of the appended claims. The present disclosure includes all combinations of the individual features presented.

LIST OF REFERENCE SIGNS 1 structural element
2 extrinsic structural element
3 location of the assembly error
4 axis of rotation
5, 5' axis of rotation
6 minimum

What is claimed is:

1. A method, comprising:
   a) exciting a first structural element to vibrations with respect to axes of vibration in at least three independent spatial directions and capturing the vibration behavior of the excited first structural element;
   b) comparing the captured vibration behavior to a reference behavior of a correctly mounted structural element and determining whether a deviation that exceeds a determined limit value has occurred; and
   at least one of the following:
      c1) repeatedly performing a) and b), wherein during the repeated performance of a) and b), an excitation of the first structural element to vibrations with respect to axes of vibration in at least three independent spatial directions is performed that differs from the previous excitations, identifying the excited axes of vibration having a minimum and/or a maximum deviation from the reference behavior, and localizing an assembly error on the basis of the identified axes of vibration; and
      c2) evaluating the captured vibration behavior with respect to a plurality of fictitious axes of vibration, identifying the fictitious axis of vibration having a minimum and/or a maximum deviation from the reference behavior, and localizing an assembly error on the basis of the identified fictitious axis of vibration,
   wherein the first structural element comprises an optical component of a projection exposure apparatus.

2. The method of claim 1, comprising c1 but not c2.

3. The method of claim 1, comprising c2 but not c1.

4. The method of claim 1, comprising c1 and c2.

5. The method of claim 1, wherein a) comprises exciting rotational vibrations about at least one axis of rotation.

6. The method of claim 1, wherein a) comprises exciting rotational vibrations about three axes of rotation in three independent spatial directions.

7. The method of claim 1, wherein a) comprises exciting translational vibrations in at least one spatial direction.

8. The method of claim 1, wherein a) comprises exciting translational vibrations in a plurality of independent spatial directions.

9. The method of claim 1, comprising c2, wherein:
   the plurality of the fictitious axes of vibration are defined by axes that extend through the center of mass of the structural element under investigation;
   the plurality of the fictitious axes have spherical coordinates with an azimuth angle φ between 0 and $2\pi$ and a polar angle ϑ between 0 and $2\pi$; and
   the azimuth angle φ and polar angle ϑ vary in stepwise fashion with a uniform distance between 0 and $2\pi$.

10. The method of claim 9, comprising c2, wherein performing the evaluation of the captured vibration behavior with respect to a plurality of fictitious axes of rotation.

11. The method of claim 9, comprising c2, wherein performing the evaluation of the captured vibration behavior with respect to a plurality of fictitious axes of translation.

12. The method of claim 1, comprising c2, wherein performing the evaluation of the captured vibration behavior with respect to a plurality of fictitious axes of rotation.

13. The method of claim 1, comprising c2, wherein performing the evaluation of the captured vibration behavior with respect to a plurality of fictitious axes of translation.

14. The method of claim 1, further comprising performing at least two times a) and b) and at least one member selected from c1) and c2), wherein, during the second performance, the position of the center of mass of the first structural element is changed by adding or removing mass, or the effective point of attack of the forces for the vibration excitation is changed by superposing excitation forces.

15. The method of claim 1, further comprising performing a plurality of time a) and b) and at least one member selected from c1) and c2), wherein, after the first time, the position of the center of mass of the first structural element is changed by adding or removing mass, or the effective point of attack of the forces for the vibration excitation is changed by superposing excitation forces.

16. The method of claim 1, comprising exciting the vibrations over a frequency range.

17. The method of claim 16, further comprising forming a ratio of the amplitude of the captured vibration behavior at a specific frequency to the amplitude of the reference behavior at the frequency as a measure for the deviation of the captured vibration behavior from the reference behavior.

18. The method of claim 1, further comprising forming a ratio of the amplitude of the captured vibration behavior at a specific frequency to the amplitude of the reference behavior at the frequency as a measure for the deviation of the captured vibration behavior from the reference behavior.

19. One or more machine-readable hardware storage devices, comprising instructions that are executable by one or more processing devices to perform operations comprising the method of claim 1.

20. A system, comprising:
   one or more processing devices; and
   one or more machine-readable hardware storage devices comprising instructions that are executable by the one or more processing devices to perform the method of claim 1.

* * * * *